US00RE39534E

(19) United States
(12) Reissued Patent
Cooperberg et al.

(10) Patent Number: US RE39,534 E
(45) Date of Reissued Patent: Mar. 27, 2007

(54) METHOD AND APPARATUS TO CALIBRATE A SEMI-EMPIRICAL PROCESS SIMULATOR

(75) Inventors: David Cooperberg, Mount Kisco, NY (US); Richard A. Gottscho, Pleasanton, CA (US); Vahid Vahedi, Albany, CA (US)

(73) Assignee: Lam Research Corporation, Fremont, CA (US)

(21) Appl. No.: 10/302,567

(22) Filed: Nov. 22, 2002

Related U.S. Patent Documents

Reissue of:
(64) Patent No.: 6,301,510
Issued: Oct. 9, 2001
Appl. No.: 09/607,882
Filed: Jun. 30, 2000

U.S. Applications:
(63) Continuation-in-part of application No. 09/033,997, filed on Mar. 3, 1998, now Pat. No. 6,151,532.

(51) Int. Cl.
*G05B 13/02* (2006.01)

(52) U.S. Cl. ..... 700/28; 700/30; 700/31; 700/34; 700/47; 700/52; 700/121; 702/81; 702/85; 702/104; 703/6; 703/22; 438/5; 438/14

(58) Field of Classification Search ..... 700/28, 700/30–34, 46–47, 52, 108, 117, 121; 702/108, 702/115–118, 121, 124, 81–85; 438/5–9, 438/14–18; 703/6, 22
See application file for complete search history.

(56) References Cited

U.S. PATENT DOCUMENTS 4,663,513 A 5/1987 Webber
5,107,105 A 4/1992 Isobe
5,225,740 A 7/1993 Ohkawa (Continued)

FOREIGN PATENT DOCUMENTS

EP 0 602 855 6/1994

OTHER PUBLICATIONS

Bailey D. III et al., Scaling of Si and GaAs Trench Etch Rates with Aspect Ratio, Feature Width, and Substrate Temperature, J. Vac. Sci. Technol. B 13(1), Jan./Feb. 1995, pp. 92–104.
Barone et al., "Molecular Dynamics Simulations of Plasma–Surface Chemistry", Plasma Sources Sci. Technol. 5, 1996, pp. 187–192.

(Continued)

*Primary Examiner*—Ramesh Patel
(74) *Attorney, Agent, or Firm*—Thelen Reid & Priest LLP; David B. Ritchie

(57) ABSTRACT

A method and apparatus for calibrating a semi-empirical process simulator used to determine process values in a plasma process for creating a desired surface profile on a process substrate includes providing a test model which captures all mechanisms responsible for profile evolution in terms of a set of unknown surface parameters. [A set] *Sets* of test [conditions] *processes* [is] *are* derived for which the profile evolution is governed by only a limited number of parameters. For each set of test [conditions] *process*, *model* test values are selected and [a] test [substrate is] *substrates are* actually subjected to [a] *the* test [process] *processes* [defined by the test values], thereby creating [a] test surface [profile] *profiles*. The test values are used to generate [an] approximate profile [prediction] *predictions* and are adjusted to minimize the discrepancy between the test surface [profile] *profiles* and the approximate profile [prediction] *predictions*, thereby providing a final model of the profile evolution in terms of the process values.

18 Claims, 4 Drawing Sheets

U.S. PATENT DOCUMENTS

| | | | | | |
|---|---|---|---|---|---|
| 5,270,222 | A | | 12/1993 | Moslehi | |
| 5,290,382 | A | | 3/1994 | Zarowin et al. | |
| 5,399,229 | A | | 3/1995 | Stefani et al. | |
| 5,422,139 | A | | 6/1995 | Fischer | |
| 5,642,296 | A | | 6/1997 | Saxena | |
| 5,654,903 | A | * | 8/1997 | Reitman et al. | 702/81 |
| 5,679,599 | A | | 10/1997 | Mehta | |
| 5,711,843 | A | * | 1/1998 | Jahns | 156/345.24 |
| 5,737,496 | A | * | 4/1998 | Frye et al. | 706/23 |
| 5,819,073 | A | | 10/1998 | Nakamura | |
| 5,861,752 | A | | 1/1999 | Klick | |
| 5,866,437 | A | * | 2/1999 | Chen et al. | 438/14 |
| 5,869,402 | A | | 2/1999 | Harafuji et al. | |
| 5,871,805 | A | | 2/1999 | Lemelson | |
| 5,900,633 | A | | 5/1999 | Solomon et al. | |
| 5,933,345 | A | | 8/1999 | Martin et al. | |
| 5,949,678 | A | * | 9/1999 | Wold et al. | 700/83 |
| 5,963,710 | A | | 10/1999 | Masumoto | |
| 5,966,312 | A | * | 10/1999 | Chen | 703/6 |
| 5,966,527 | A | * | 10/1999 | Krivokapic et al. | 703/14 |
| 6,041,734 | A | | 3/2000 | Raoux et al. | |
| 6,110,214 | A | | 8/2000 | Klimasauskas | |
| 6,136,388 | A | | 10/2000 | Raoux et al. | |
| 6,151,532 | A | * | 11/2000 | Barone et al. | 700/121 |
| 6,162,709 | A | | 12/2000 | Raoux et al. | |
| 6,301,510 | B1 | | 10/2001 | Cooperberg et al. | |
| 6,577,915 | B1 | * | 6/2003 | Cooperberg et al. | 700/121 |
| 6,804,572 | B1 | * | 10/2004 | Cooperberg et al. | 700/121 |
| 6,830,650 | B2 | | 12/2004 | Roche et al. | |
| 2004/0107906 | A1 | | 6/2004 | Collins et al. | |

OTHER PUBLICATIONS

Chang et al., "Plasma–Surface Kinetics and Feature Profile Evolution in Chlorine Etching of Polysilicon", J. Vac. Sci. Technol. A 16(1), Jan./Feb. 1998, pp. 217–224.

Gottscho et al., "Microscopic Uniformity in Plasma Etching", J. Vac. Sci. Technol. B 10(5), Sep./Oct. 1992, pp. 2133–2147.

Hamaguchi et al., "Liner Conformality in Ionized Magnetron Sputter Metal Deposition Processes", J. Vac. Sci. Technol. B 14(4), Jul./Aug. 1996, pp. 2603–2608.

Hamaguchi, "Mathematical Methods for Thin Film Deposition Simulations", Thin Films, vol. 22, pp. 81–115.

Han et al., "Profile Modeling of High Density Plasma Oxide Etching", J. Vac. Sci. Technol. B 13(4) Jul./Aug. 1995, pp. 1893–1899.

Li et al., "Simulation and Experimental Analysis of Planarization of Refractory Metals Using A Multi–Step Sputter/Sputter Etch Process", Journal of Electronic Materials, vol. 23, No. 11, 1994, pp. 1215–1220.

Liao et al., "Simulations of Metal Thin Film Thermal Flow Processes", Vac. Sci. Technol. B 14(4), Jul./Aug. 1996, pp. 2615–2622.

Moyne et al., "Adaptive Extensions to a Multibranch Run–to–Run Controller for Plasma Etching", J. Vac. Sci. Technol. A 13(3), May/Jun. 1995, pp. 1787–1791.

Rietman, "Neural Networks in Plasma Processing", J. Vac. Sci. Technol. B 14(1), Jan./Feb. 1996, pp. 504–510.

Singh et al., "The Effect of Surface Transport on the Evolution of Film Microstructure in Plasma Etching and Deposition", Elsevier Science, 1997, pp. 37–40.

Thallikar et al., "Experimental and Simulation Studies of Thermal Flow of Borophosphosilicate and Phosphosilicate Glasses", J. Vac. Sci. Technol. B 13(4), Jul./Aug. 1995, pp. 1875–1878.

Vahedi et al., "Capacitive RF Discharges Modelled by Particle–in–Cell Monte Carlo Simulation I: Analysis of Numerical Techniques", Plasma Sources Sci. Technol. , 1993, pp. 261–272.

Vahedi et al., "Capacitive RF Discharges Modelled by Particle–in–Cell Monte Carlo Simulation II: Comparisons with Laboratory Measurements of Electron Energy Distribution Functions", 1993, Plasma Sources Sci. Technol. 2, pp. 273–278.

* cited by examiner

METHOD AND APPARATUS TO CALIBRATE A SEMI-EMPIRICAL PROCESS SIMULATOR

Matter enclosed in heavy brackets [ ] appears in the original patent but forms no part of this reissue specification; matter printed in italics indicates the additions made by reissue.

CROSS-REFERENCE TO RELATED APPLICATIONS

This is a continuation-in-part of U.S. patent application Ser. No. 09/033,997, now U.S. Pat. No. 6,151,532 filed Mar. 3, 1998 in the names of inventors Maria E. Barone, Richard A. Gottscho, and Vahid Vahedi and commonly assigned herewith. It is also related to Applications of a semi-empirical physically based profile simulator, Enhanced process and profile simulator algorithms filed in common date herewith.

BACKGROUND OF THE INVENTION

1. Field of the Invention

This invention relates to plasma processing of semiconductor devices. In particular, this invention provides a method and apparatus to calibrate a semi-empirical process simulator for predicting the surface profile and the etch or deposition rates that a given plasma process will create.

2. Background Art

Various forms of processing with ionized gases, such as plasma etching and reactive ion etching, are increasing in importance particularly in the area of semiconductor device manufacturing. Of particular interest are the devices used in the etching process. FIG. 1A illustrates a conventional inductively coupled plasma etching system 100 that may be used in the processing and fabrication of semiconductor devices. Inductively coupled plasma processing system 100 includes a plasma reactor 102 having a plasma chamber 104 therein. A transformer coupled power (TCP) controller 106 and a bias power controller 108 respectively control a TCP power supply 110 and a bias power supply 112 influencing the plasma created within plasma chamber 104.

TCP power controller 106 sets a set point for TCP power supply 110 configured to supply a radio frequency (RF) signal, tuned by a TCP match network 114, in a TCP coil 116 located near plasma chamber 104. A RF transparent window 118 is typically provided to separate TCP coil 116 from plasma chamber 104 while allowing energy to pass from TCP coil 116 to plasma chamber 104.

Bias power controller 108 sets a set point for bias power supply 112 configured to supply a RF signal, tuned by a bias match network 120, to an electrode 122 located within the plasma reactor 104 creating a direct current (DC) bias above electrode 122 which is adapted to receive a substrate 124, such as a semi-conductor wafer, being processed.

A gas supply mechanism 126, such as a pendulum control valve, typically supplies the proper chemistry required for the manufacturing process to the interior of plasma reactor 104. A gas exhaust mechanism 128 removes particles from within plasma chamber 104 and maintains a particular pressure within plasma chamber 104. A pressure controller 130 controls both gas supply mechanism 126 and gas exhaust mechanism 128.

A temperature controller 134 controls the temperature of plasma chamber 104 to a selected temperature setpoint using heaters 136, such as heating cartridges, around plasma chamber 104.

In plasma chamber 104, substrate etching is achieved by exposing substrate [104] *124* to ionized gas compounds (plasma) under vacuum. The etching process starts when the gases are conveyed into plasma chamber 104. The RF power delivered by TCP coil 116 and tuned by TCP match network 110 ionizes the gases. The RF power, delivered by electrode 122 and tuned by bias match network 120, induces a DC bias on substrate 124 to control the direction and energy of ion bombardment of substrate 124. During the etching process, the plasma reacts chemically with the surface of substrate 124 to remove material not covered by a photoresistive mask.

Input parameters such as plasma reactor settings are of fundamental importance in plasma processing. The amount of actual TCP power, bias power, gas pressure, gas temperature, and gas flow within plasma chamber 104 greatly affects the process conditions. Significant variance in actual power delivered to plasma chamber 104 may unexpectedly change the anticipated value of other process variable parameters such as neutral and ionized particle density, temperature, and etch rate.

Traditionally, a suite of values of these input parameters suitable for creating a given set of device features has been determined by trial and error. Development of a single process by this empirical approach is costly and time-consuming, requiring treatment of several patterned wafers and subsequent study of the resulting profiles by scanning electron microscopy. Because of the unpredictable way a small change in one input parameter may affect the profile, any modification of the layout—for example, in device dimension, pattern density on the wafer or change in total open area—from one application to another, has often necessitated redevelopment of the process, with the attendant outlay of resources.

Recent advances in device fabrication technology are rendering this approach even more onerous. Decreasing feature sizes demand tighter tolerances on feature dimensions and morphologies, so that the number of trials required to optimize a given process is increasing. The acceleration of wafer diameter growth and the complete redesign of the process involved with an incremental change in diameter have increased the number of times this empirical process must be repeated. The increasing use of devices tailor-made to a specific application also increases the amount of development and optimization activity required.

An alternative, computational approach would derive input parameters from a complete physical description of a plasma process including a plasma model for describing the coupling between the macroscopic input parameters and the macroscopic fluxes, concentrations and energy distributions of the various species in the plasma; and a profile simulator for determining atomistically from the macroscopic fluxes the resulting etch or deposition rate along the wafer surface and calculating the profile evolution therefrom. Ideally, such a physical description of plasma etching and deposition processes would enable the ab initio selection of the macroscopic input parameters appropriate for generating a desired profile on the substrate, eliminating the need for expensive and time-consuming test sequences.

Research in this field has done much to elucidate mechanisms at work in plasma processes, and thus has contributed scaling laws that could frame a physical description. However, notwithstanding the availability of computational means sufficiently powerful to perform the necessary calculations based on known scaling laws, the implementation of such an ab initio approach has been limited by lack of data. For example, the manner in which the values of some coefficients in these laws depend on the particulars of a given process is unknown as yet. In some investigations, determination of the value of such a scaling coefficient consistent with a plasma process defined by a given set of input parameters has been done by comparing a finished profile, created by applying that process, with a simulated profile including one or more of these coefficients as adjustable parameters. Such hindsight evaluation may promote understanding a given coefficient's role in scaling law, but it has not afforded the ability to predict profile evolution for any process defined by a set of input parameters differing from the set used in the experimental process used to derive the value of that coefficient.

Thus, there is a need for a method for calibrating a semi-empirical process simulator for predicting the surface profiles and the etch or deposition rates that a given plasma process will create.

SUMMARY OF THE INVENTION

A method and apparatus for calibrating a semi-empirical process simulator used to determine process values in a plasma process for creating a desired surface profile on a process substrate includes providing a test model which captures all mechanisms responsible for profile evolution in terms of a set of unknown surface parameters. [A set] *Sets* of test [conditions] *processes* [is] *are* derived for which the profile evolution is governed by only a limited number of parameters. For each set of test [conditions] *process*, *model* test values are selected and [a] test [substrate is] *substrates are* actually subjected to [a] *the* test [process] *processes* [defined by the test values], thereby creating [a] test surface [profile] *profiles*. The test values are used to generate [an] approximate profile [prediction] *predictions* and are adjusted to minimize the discrepancy between the test surface [profile] *profiles* and the approximate profile [prediction] *predictions*, thereby providing a final model of the profile evolution in terms of the process values.

DETAILED DESCRIPTION OF A SPECIFIC EMBODIMENTS OF THE INVENTION

Figure 1A:
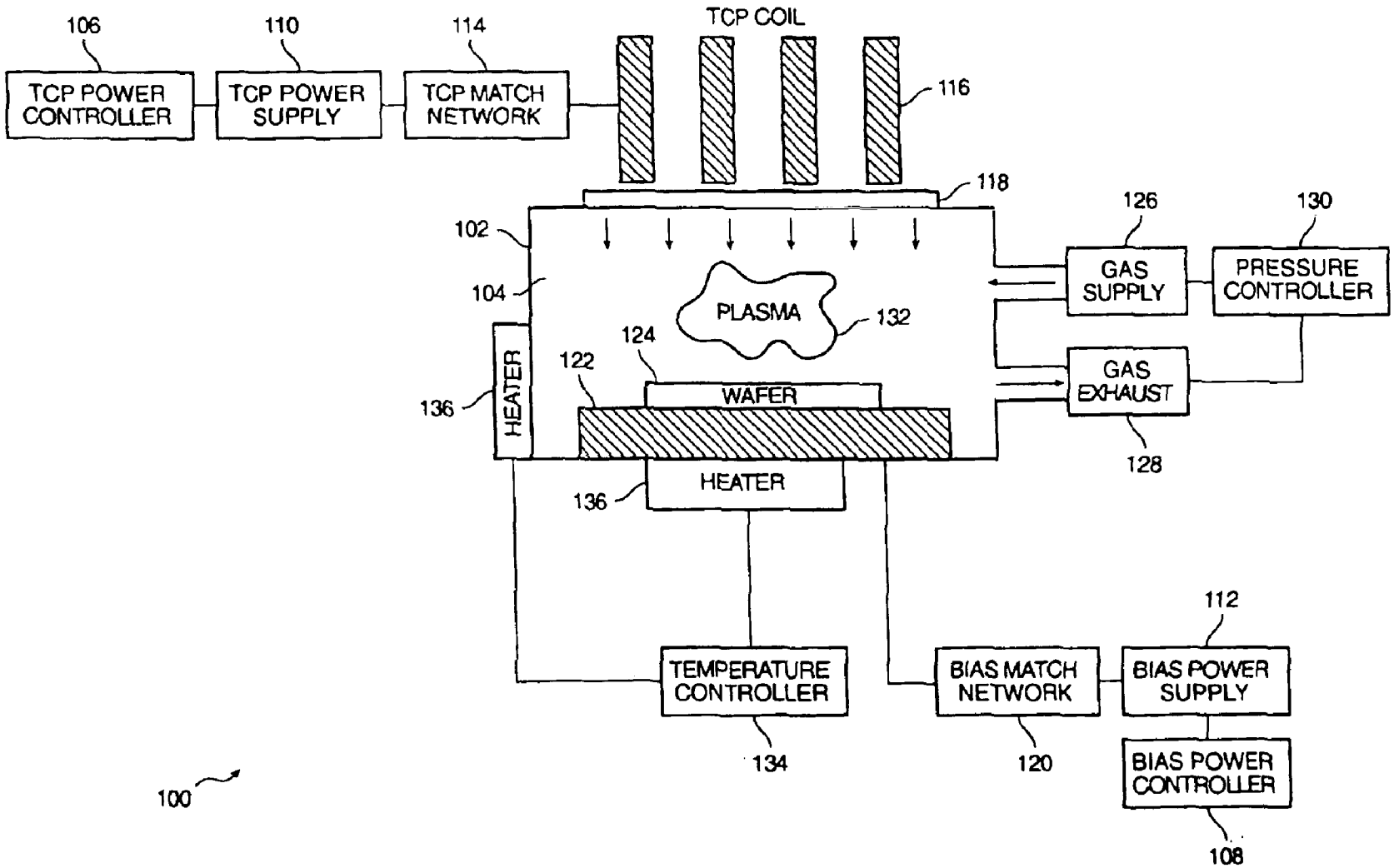
FIG. 1A is a block diagram illustrating a plasma etching system.
Figure 1B:
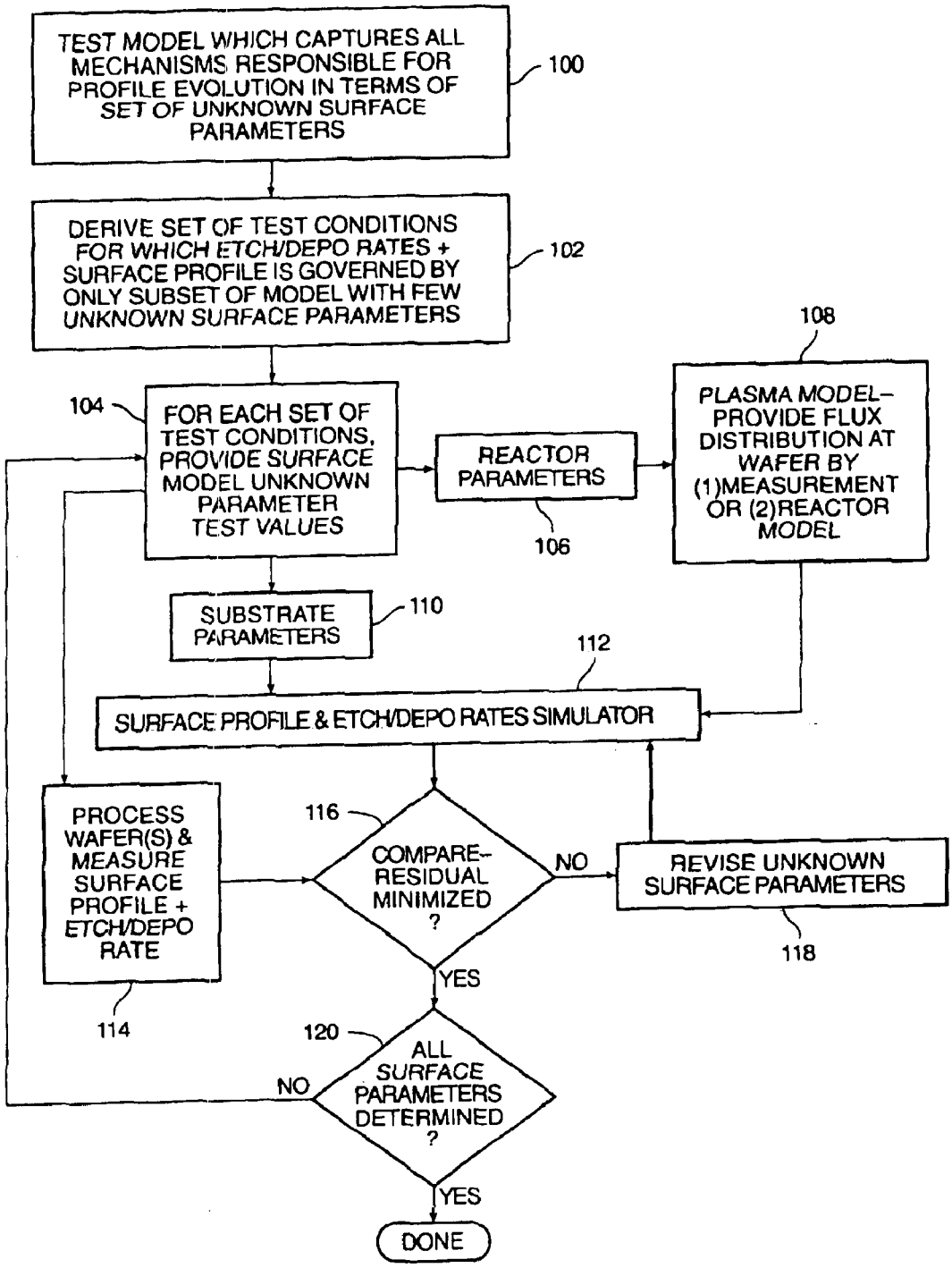
FIG. 1B is a flow chart illustrating a first calibration process in accordance with a specific embodiment of the present invention.

Those of ordinary skill in the art will realize that the following description of the present invention is illustrative only and not in any way limiting. Other embodiments of the invention will readily suggest themselves to such skilled persons having the benefit of this disclosure.

A semi-empirical process simulator is a model that seeks to determine the values of input parameters in a plasma process for creating a desired surface profile on a substrate, such as a semi-conducting wafer. Previous calibration schemes used in the process simulator relied on fitting the simulation output to test data gathered near a process window of interest. While useful, this technique is likely to produce more empirical and less physically based models. An alternative approach to calibration is to design sets of experiments in which the results are functions of fewer unknown parameters and for which coefficient values can be derived from best fit to data with greater confidence. The present invention seeks to improve such calibration process by using models that more faithfully capture the actual kinetics governing feature evolution and are likely to yield more accurate profile predictions when using reactor settings which may lie outside a previously calibrated window of operation.

The form of the surface kinetic model for each class of exposed film and class of plasma chemistry may be derived from experimentally observed trends and scalings. Unknown model coefficients however must be calibrated for each specific film and chemistry. A complete surface kinetics model includes equations governing surface coverage and an equation governing etch or deposition rate. Surface reaction rates for the adsorption, desorption, and surface reactions of active neutral species lead to a determination of surface coverage. The mechanisms determining local etch rate will be functions of the computed surface coverage and the ion and neutral flux distributions incident on a feature surface element. Etch mechanisms include physical sputtering due to energetic particle bombardment, chemical assisted sputtering which additionally depends on the surface concentration of one or more etchant species, and thermal etching dependent only on chemical coverages (and surface temperature). Deposition rate is typically defined by the adsorption rate of depositing neutral species.

The general procedure to calibrate a semi-empirical process simulator is illustrated in FIG. [1] *1B*. Free parameters needed to characterize mechanisms such as thermal etching, ion enhanced etching, physical sputtering, and deposition are determined by performing test processes under conditions where only a limited number of such mechanisms contribute to etch or deposition rates and/or surface profiles. The reduced set of unknown surface parameters can then be determined by best fit to etch rate and/or surface profile data collected under these conditions.

In block 100, a test model which captures all mechanisms responsible for profile evolution in terms of a set of unknown surface parameters is provided. The input parameters include descriptors of the pre-processing state of the substrate ("substrate parameters") and quantities defining the operation of a given plasma reactor during the test process ("reactor parameters"). The substrate parameters may include, for example, gross dimensions of the substrate, the distribution and dimensions of any features on the surface, and the substrate composition. The reactor parameters may include any of: power levels, gas temperature, gas pressure, inlet gas composition, and length of time the substrate is treated by the plasma process.

In block 102, [a set] *sets* of test [conditions is] *process(es) are* derived [from a subset of the test model defined in block 100] such that only a limited number of unknown surface parameters *of the test model defined in block 100* [contribute] *contributes* to the etch or deposition rates and the surface profiles. Such test [conditions is] *process(es) are* derived by adjusting the value of *the input parameters such that* some of the surface *model* parameters [to render their effects] *have* negligible [on the test processes] *effect on the etch/deposition rates or surface profile evolution.*

For each set of test [conditions] *process(es)* defined in block 102, surface model unknown parameter test values are yet to be solved for. In block [104] *111*, these unknown parameter test values are isolated by eliminating parameters that do not contribute to etch or deposition rates or feature evolution.

[The unknown parameter test values of reactor variables and reactor fixed] *Test process(es) reactor* parameters as selected in block 106, are used in block 108, in which a plasma model, containing a mathematical description of the plasma in terms of the reactor parameters for the reactor of interest and coefficients of known or empirically determined value, operates to approximately determine the macroscopic properties of the plasma generated by the test [process] *processes*. The plasma model characterizes the species of interest only as belonging to a general class of actors, for example, as being either charged particles, and thus attracted to the substrate by any applied bias, or neutral species such as gas molecule and excited radicals. Physical models—for example, Maxwell's and Boltzmann's equations—underlying the functional dependence in terms of governing experimental input parameters of such plasma descriptors as particle fluxes, energy, and angular distributions are well known in the art. (See, e.g., Lieberman and Lichtenberg, Principles of Plasma Discharges and Materials Processing, John Wiley, 1994). Much is known in the art about how these descriptors scale with the input parameters, based on such basic physical models in conjunction with experimental data. However, the absolute value of these fluxes or distributions is not known a priori for a given process. Any such coefficient in the reactor model whose value is unknown is treated by the calibration as an adjustable parameter or is determined experimentally.

Those macroscopic properties of the plasma can alternatively be determined by measuring the flux distribution at the wafer in a laboratory under the [set] *sets* of test [conditions] *process(es)* as selected in block [104] *102*.

In block 112, a profile simulator, containing a mathematical model of the time evolution of the substrate surface profile in terms of the substrate parameters, the macroscopic plasma properties, and coefficients of unknown value, uses the results of block 108 and the substrate parameters provided in block 110 to approximately predict the etch or deposition rates and surface profiles on the substrate *for each set of test process(es) defined in block 104*. In general, such mathematical model includes a local transport model for calculating fluxes arriving at each point along the substrate surface, a site balance model for calculating the resulting local etch and deposition rates, and a surface advancement algorithm. In a presently preferred specific embodiment of the present invention, a well-known Monte Carlo type approach is used for the local transport.

Figure 3:
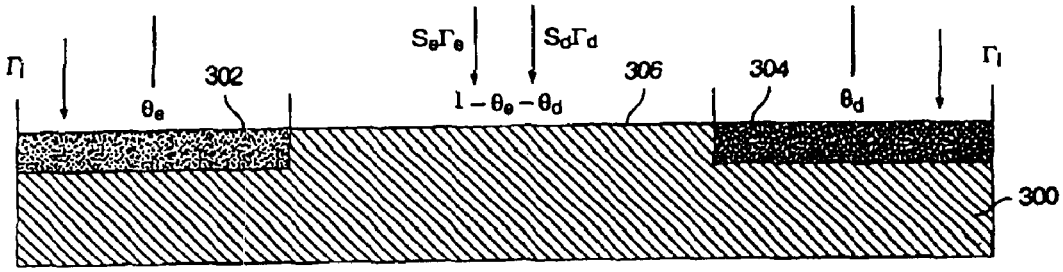
FIG. 3 is an elevational cross-sectional diagram depicting surface kinetics in a plasma process according to the Langmuir model.

The site balance model is preferably based on a Langmuir-type model of the kinetics of particle-surface interactions. The model characterizes species that remove material from the substrate as etchants and those that deposit material onto the substrate surface as inhibitors. With reference to FIG. 3, $\Gamma_e$ and $\Gamma_d$ respectively represent fluxes of etchants and inhibitors arriving at the surface of the substrate 300. Both etchants and inhibitors react with the surface when they encounter a vacant site. Etchant and inhibitor species react at the surface with respective open-field field reaction coefficients of $S_e$ and $S_d$ to form etchant site 302 and inhibitor site 304. The overall occupancies of the substrate surface sites resulting from reactions with etchant and inhibitor species are represented respectively by fractions $\theta_e$ and $\theta_d$, with the number of vacant sites 306 being equal to $1-\theta_e-\theta_d$. Etch products can form and thermally desorb from the surface. Ions arriving at the surface, at flux $\Gamma$, can remove etchants that have reacted with the surface by physical sputtering and ion-enhanced etching; arriving ions can also remove inhibitors from the surface by physical sputtering. Taking into account these assumptions and mechanisms, the site balance, in the steady state, for the two types of occupied sites be expressed respectively as $$o_e d0_e/dt=\Gamma_e S_e(1-0_d-\theta_e)-0_e k_{s1}\theta_{1e}-0_e k_{e1}\theta_{1e}k_{the}0_e=0 \text{ and}$$

$$o_d d\theta_e/dt=\Gamma_d S_d(1-\theta_d-\theta_e-\theta_d K_{s1}\Gamma_{1e}= {}_s$$

Wherein $k_{e1}$, $k_{s1}$, and $k_{th}$ are coefficients, generally of unknown value, associated with the ion-enhanced, physical sputtering and thermal etching mechanisms, respectively. The parameters $\Gamma_{re}$ and $\Gamma_{is}$ are products of ion-enhanced etching and physical sputtering yields, respectively, with ion flux integrated over incident ion energies greater than respective threshold energies, expressed respectively as $E_{th}$ and $E_{th}$, and over all angles, $$\Gamma_{ie}=\int\int Y_{ie}\phi F)\Gamma_1(\phi,\ F_e=\int dF.(F.^{1/2}E_{sh,s}{}^{1/2})\int d\phi Y_e(\phi,\Gamma_e)\int(\phi,\ E) \text{ and}$$

$$\Gamma_{is}=\int\int Y_{is}(\phi,E)\Gamma_1(\phi,E)d\phi dE=\int dE(E^{1/2}-E_{th,s}{}^{1/2})\int d\phi Y_s(\phi,E)_1(\phi,E)$$

This model assumes that the etch yields are products of angular functions and the square root of ion energy, which dependence has been observed experimentally. However, other scaling laws could be used instead. The yield functions only represent functional dependencies, the absolute magnitudes being lumped into the coefficients k's along with other constants.

Expressions for $\theta_e$ and $\theta_d$ can be derived from the steady-state site balance equation on each type of surface present on the substrate, for example the substrate top and trench bottoms and sidewalls. At each point on the surface, the etch rate, ER, can be written:

$$ER=k_{s2}\beta_{1s}+\theta_e k_{e2}\Gamma_{ie}+k_{sh}\Gamma_e-k_d\theta_d S_d(1-0_e)$$

The coefficients $k_{e2}$, $k_{s2}$, $k_d$ and $k_{th}$ are yield constants associated with physical sputtering, ion-enhanced etching, thermal etching and ion-induced deposition, respectively. Incorporating the expressions for $\theta_e$, $\theta_d$, $\Gamma_{1s}$ and $\Gamma_{ie}$ renders the etch rate in terms of the plasma characteristics and the coefficients k, each of which is in principle an adjustable parameter that can be determined by the calibration.

It is also preferred to employ an analytic scheme for surface advancement so that the fine features can be resolved more accurately. One such scheme known in the art and capable of modeling fine feature aspects, such as sharp corners, is the method of characteristics, also known as the shock-front-tracking algorithm. (See, e.g., S. Hamaguchi, "Modeling of Film Deposition for Microelectronic Applications", Thin Films, vol. 22, p. 81, S. Rossnagel, ed. Academic Press, San Diego, 1996). Another is the level set approach. (See, e.g., J. A. Sethian, Level Set Methods: Evolving Interfaces in Geometry, Fluid Mechanics, Computer Vision, and Materials Science, Cambridge University Press 1996). The shock-front-tracking approach models the surface (i.e., the interface layer between vacuum and solid) as a collection of piecewise continuous line segments, for each of which a rate of movement is calculated. The possibility of each segment's advancing or receding along its normal independently of the movement of the other segments allows for multiple potential solutions for the resulting surface. In order to avoid multiple solutions, these analytic schemes model the points between the line segments as shocks (i.e., discontinuities in the slope), and properly track the movement of the shocks.

Thus, the cumulative output of blocks 104 through 112, particularly of the operation of the plasma model in block 108 and the profile simulator in block 112, which together comprise an initial mathematical surface profile model as specified above, generates a quantitative but approximate prediction of the etch or deposition rates and surface profile(s) created by the test [process] *processes.*

In block 114, [the test values of the input parameters] *the test process(es)* provided in block 104 are used to provide [a] test surface [profile] *profiles*, created experimentally by subjecting [a] test [substrate] *substrate(s)* to [a] test [process] *processes*, in the reactor of interest, defined by the test values of the input parameters. The etch or deposition rates and surface profile(s) of the test [substrate] *substrates* are then measured. In block 116, the etch or deposition rates and surface profile(s) of the test [substrate] *substrates* are quantitatively compared with the quantitative approximate [prediction] *predictions* resulting from block 112. The difference between the test surface profile(s) and/or etch/deposition rates and the approximate prediction(s) is evaluated according to some criterion, such as an accuracy of range of 10%, applied in block 116.

In general, on the first pass, in which the approximate prediction(s) is computed using preliminary test values of unknown surface parameters, the residual is not sufficiently small to satisfy the criterion, and the calibration procedure advances to block 118, in which the values of the unknown surface parameters are adjusted so as to minimize the discrepancy. The adjusted values are then resubmitted to the profile simulator of block 112 and the plasma model of block 108, for another iteration that render the approximate profile prediction(s) and of the comparison in block 116. Iteration continues until the discrepancy between the test surface profile(s) and the approximate prediction(s) is adequately minimized.

Thus, both block 116 and block 118 effect a calculation of optimum values of the unknown surface parameters test values appearing in the initial mathematical surface profile model. After the surface parameters suitable for the current set of [conditions] *test process(es)* are determined, a different set of [conditions] *test process(es)* in block 104 is selected from block 102 and its respective surface parameters are determined using the same process of block 104 through block 120 until all surface parameters are determined.

For example, physical sputtering yield, energy scaling, and energy threshold coefficients may be obtained by fitting to etch rate data and final profile SEM (Scanning Electron Micrograph) data collected after wafer processing in a chemically inert plasma such *as* an argon discharge with the ion flux and energy distribution to the separately measured or modeled. Coefficients representing thermal etch rate may be obtained by best fit to etch rate data collected under conditions for which there is no energetic ion bombardment. If sufficient gas phase reactant density can be achieve the surface will saturate and the dependence of etch rate on adsorption probability can be eliminated leaving saturated etch rate as the only unknown parameter. Patterned features including overhang structures may be etched in order to isolate surface reaction probabilities which determine transport throughout the feature. In order to calibrate models for deposited material, deposition and etch rates on blanket or patterned wafers processed under conditions favoring deposition may be collected. Incomplete film stacks may be used to isolate the mechanisms leading to redeposition. For chemically assisted sputtering, also referred to as ion-neutral synergy etching, data may be collected from wafers processed under conditions where the ratio of ion energy flux to etchant neutral flux is varied. For large (small) enough ion energy flux to etchant neutral flux ratios the etch rate is dependent only on the etchant flux (incident ion energy flux). Model fits to this etch rate and profile data combined with ion and/or neutral flux measurements and/or models can be used to determine unknown coefficients including neutral sticking coefficient, neutral desorption and/or recombination rates, average etch product stoichiometry, and yield per incident ion as a function of energy and angle. For all the sets of experiments above subsets of the complete process chemistry may be used to further isolate and calibrate specific reactions.

In one presently alternative specific embodiment, the approximate profile prediction generated by the profile simulator in block 112 comprises a series of frames, each computed after a sufficiently small time increment, and block 114 only compares frames of the approximate profile prediction that correspond to cumulative exposure times roughly equal to the time of the snapshots in the test surface profile. If the test profile includes multiple snapshots at different exposure times and/or at a different test value of one or more input parameters other than time, block 116 compares each test snapshot with the appropriate frame of the profile prediction and the system operates to minimize the residual over the entire pairwise comparison.

Figure 2:
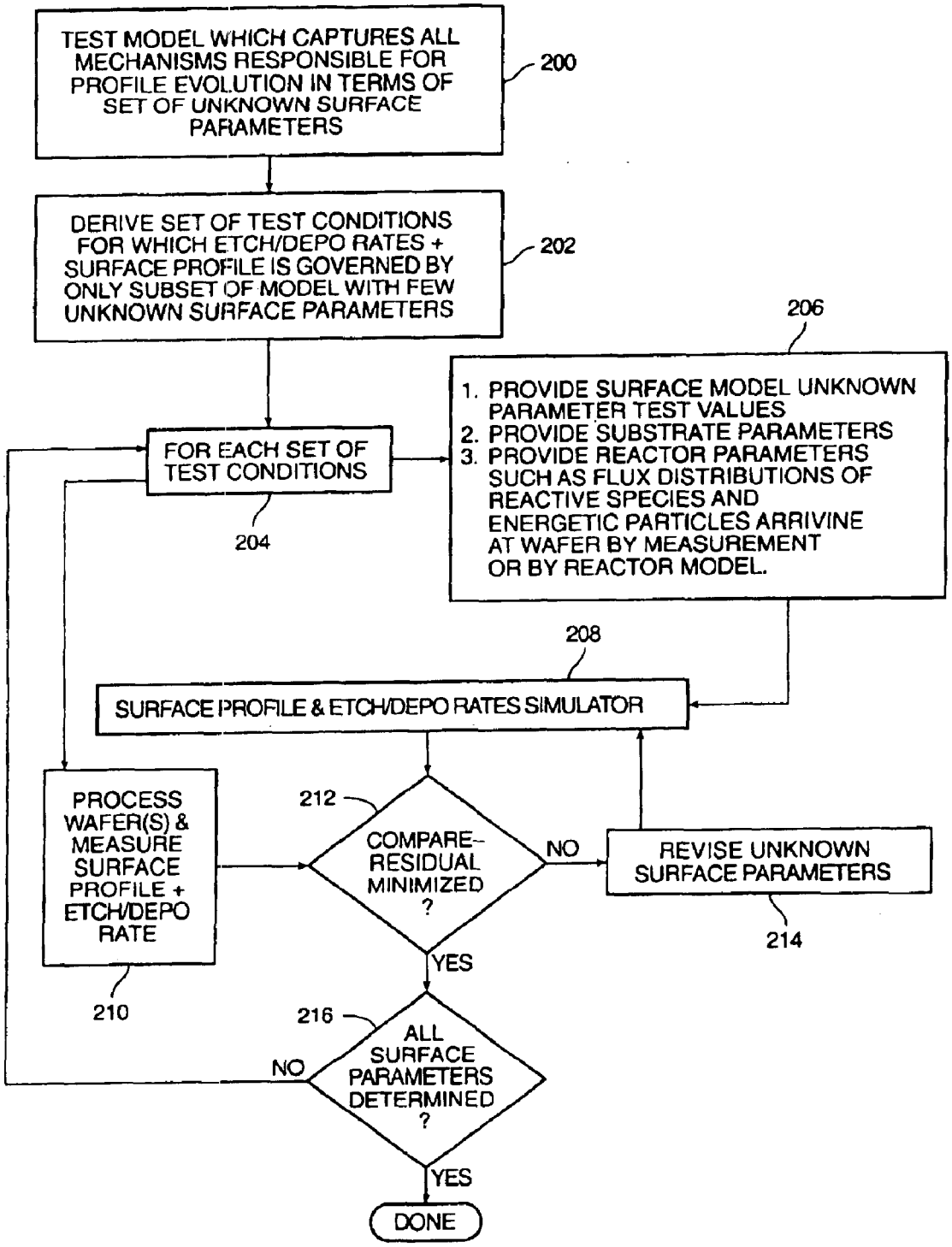
FIG. 2 is a flow chart illustrating a second calibration process in accordance with a specific embodiment of the present invention.

As will now be evident to those of ordinary skill in the art, many configurations departing from the procedure shown in FIG. [1] *1B* fall within the scope of the invention. For example, FIG. 2 illustrates another specific embodiment in which block 206 combines the plasma model with the unknown parameter test values and the substrate parameters in a single module. The entire initial mathematical surface profile model may reside in a single module, block 206, rather than being divided into distinct parts 108 (FIG. [1] *1B*) and 112 (FIG. [1] *1B*) to deal separately with phenomena acting over different length scales. Alternatively, depending on the nature of the initial mathematical surface profile model and comparison algorithm used, insertion of the test values and preliminary surface parameters into the initial mathematical surface profile model may be delayed until the comparison block.

Figure 4:
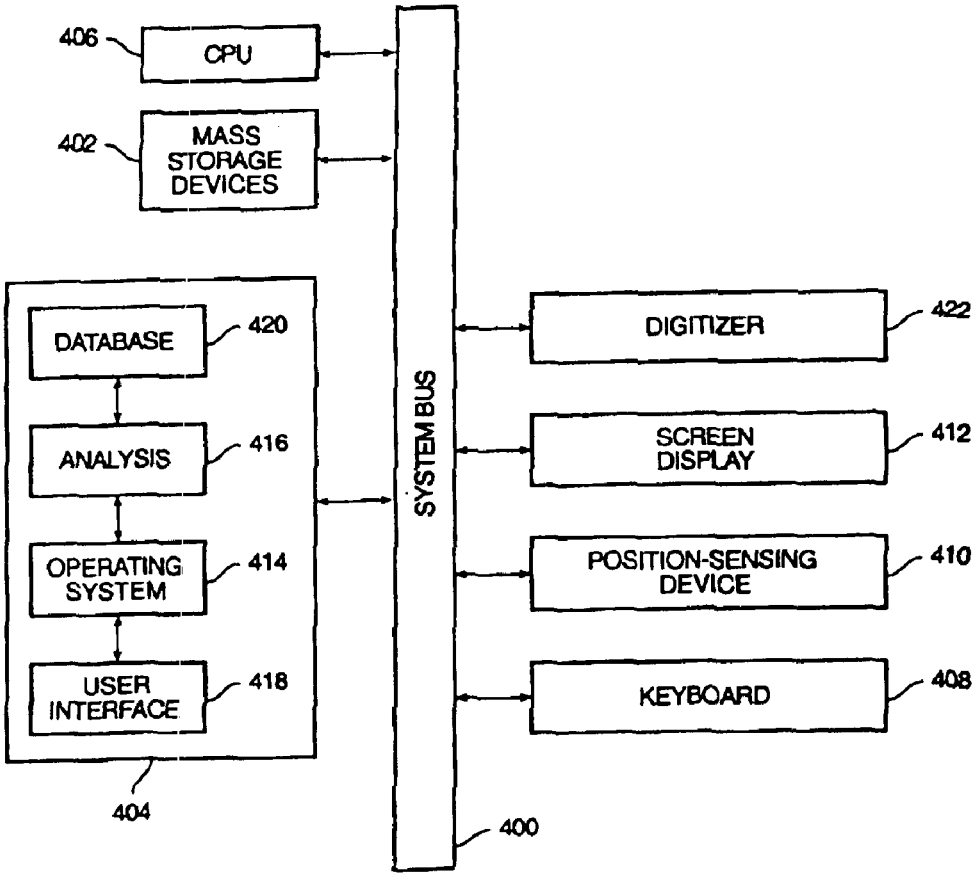
FIG. 4 is a system block diagram illustrating a representative hardware environment in accordance with a specific embodiment of the present invention.

Turning to FIG. 4, which illustrates, in block-diagram form, a hardware system incorporating the invention. As indicated therein, the system includes a system bus 400, over which all system components communicate, a mass storage device (such as a hard disk or optical storage unit) 402 as well as a main system memory 404.

The operation of the illustrated system is directed by a central-processing unit ("CPU") 406. The user interacts with the system using a keyboard 408 and a position-sensing device (e.g., a mouse) 410. The output of either device can be used to designate information or select particular areas of a screen display 412 to direct functions to be performed by the system.

The main memory 404 contains a group of modules that control the operation of CPU 406 and its interaction with the other hardware components. An operating system 414 directs the execution of low-level, basic system functions such as memory allocation, file management and operation of mass storage devices 402. At a higher level, an analysis module 416, implemented as a series of stored instructions, directs execution of the primary functions performed by the invention, as discussed below. Instructions defining a user interface 418 allow straightforward interaction over screen display 412. User interface 418 generates words or graphical images on display 412 to prompt action by the user, and accepts user commands from keyboard 408 and/or position-sensing device 410. The main memory 404 also includes one or more database 420, in general containing any of the test or process values of input parameters including input variables, the desired profile, the test surface profile and rough preliminary test values in the plasma model and profile simulator.

It must be understood that although the modules of main memory 404 have been described separately, this is for clarity of presentation only; so long as the system performs all necessary functions, it is immaterial how they are distributed within the system and its programming architecture.

The test surface profile(s) is produced experimentally, as is well known in the art, by subjecting one or more test substrates to a test process(es) in a plasma reactor and measuring the resulting surface profile using, for example, scanning electron microscopy. The desired and test surface profiles may be supplied to the hardware system in electronic format or as graphic hardcopy, in which case the image(s) is processed by a digitizer 398 before numerical comparison with the approximate prediction. The digitized profile is sent as bitstreams on the bus 400 to a database 420 of the main memory 404. The test surface profile may be stored in the mass storage device 402 as well as in database 420.

As noted above, execution of the key tasks associated with the present invention is directed by analysis module 416, which governs the operation of CPU 406 and controls its interaction with main memory 404 in performing the blocks necessary to provide a final mathematical surface profile model including calibrated optimum test values in the initial surface profile model; and, by further processing based on the final surface profile model and a desired surface profile, to determine process values of one or more input variables governing a plasma process sequence [appropriates] *appropriate* for creating the desired profile on a process substrate; or, by inserting process values of the input variables into the final mathematical model, to predictively calculate a process surface profile to be created on a process substrate by a plasma process sequence defined by the process values.

In particular, the hardware system depicted in FIG. 3 may be used to implement the calibration procedure illustrated by FIG. [1] *1B* as follows. The input variable test values selected in block 104, the test values of any fixed input parameter, and the test surface profile created in block 114 and, as needed, the desired surface profile and/or process values of interest are provided to the database 420 so that they are available to the analysis module 416. Alternatively, the module 416 may retrieve any of the test values, rough preliminary values and test surface profile data from the mass storage device 402 or user interface 418 in response to a user command. Or, the rough preliminary values may be determined by the module 416, based on the input variable test values, according to a predetermined algorithm.

Turning now to FIG. [1] *1B*, by executing the plasma modeling and profile simulation of blocks 108 and 112, respectively, the module 416 establishes the initial mathematical surface model predicting the profile created by the test process. In block 116, the module 416 (FIG. 4) accesses the test surface profile and compares it with the initial mathematical surface profile model and evaluates the residual according to some predetermined criterion. If the residual is not sufficiently small, the analysis module 416 uses the results of the comparison to adjust the test values of the plasma model and profile simulator in block 118. The new test values are retained in the database 420 for another iteration of the modeling/simulation and comparison blocks. When the test surface profile and approximate prediction are sufficiently similar, the test values used in that final iteration are stored in the database 420 as the optimum values.

The analysis module uses these optimum values of the input variables for computation of process values, which can be loaded into a plasma reactor for production of a device including the desired profile, or for profile prediction as described above.

It will therefore be seen that the foregoing represents a highly extensible and advantageous approach to plasma processing of semiconductor devices. The terms and expressions employed herein are used as terms of description and not of limitations, and there is no intention, in the use of such terms and expressions, of excluding any equivalents of the features shown and described or portions thereof, but it is recognized that various modifications are possible within the scope of the invention claimed. For example, the various modules of the invention can be implemented on a general-purpose computer using appropriate software instructions, or on a network of computers, or a multiprocessor computer or as hardware circuits, or as mixed hardware-software combinations (wherein, for example, plasma modeling and profile simulation are performed by dedicated hardware components).

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for calibrating a semi-empirical process simulator, said method comprising:

*performing test processes under conditions where only a limited number of parameters contribute to a profile evolution;* deriving a set of test conditions for which [a] *the* profile evolution is governed only by [a] *the* limited number of parameters;

selecting a plurality of test values for each said set of test conditions;

subjecting a test substrate to a test process defined by said plurality of test values, thereby creating a test surface profile;

generating an approximate profile prediction from said plurality of test values;

adjusting said plurality of test values to minimize a discrepancy between said test surface profile and said approximate profile prediction, thereby solving for said limited number of parameters; and repeating said selecting, subjecting, generating, and adjusting for another said set of test conditions until said plurality of parameters is determined, thereby providing a final model of said profile evolution in terms said plurality of parameters.

2. The method of claim 1, wherein said profile evolution comprises an etch rate, a deposition rate, and a surface profile.

3. The method of claim 1, wherein generating said approximate profile prediction includes using a plurality of preliminary test values.

4. The method of claim 3, wherein said adjusting said plurality of test values includes changing at least one preliminary test value.

5. The method of claim 4, further comprising comparing said test surface profile and said approximate profile prediction.

6. The method of claim 5, further comprising incorporating at least one changed preliminary test value.

7. The method of claim 1, wherein said semi-empirical process simulator is used to determine a plurality of parameters governing a plasma process for creating a desired surface profile on a process substrate.

8. The method of claim 7, further comprising generating a plurality of parameters from said final model and said desired surface profile.

9. The method of claim 8, further comprising generating a prediction of said surface profile from said final model and said plurality of parameters.

10. The method of claim 1, wherein said semi-empirical process simulator is used to predict a surface profile to be created on a process substrate by a plasma process defined by a plurality of parameters.

11. The method of claim 1, wherein said plurality of parameters comprises: a plurality of unknown substrate parameters and a plurality of unknown reactor parameters.

12. The method of claim 11, wherein said plurality of unknown substrate parameters comprises: a dimension of a substrate, a substrate composition, and a distribution of a feature on a surface substrate.

13. The method of claim 11, wherein said plurality of unknown reactor parameters comprises: a power level, a gas temperature, a gas pressure, a gas flow, and a gas composition.

14. The method of claim 1, wherein said plurality of parameters varies with time.

15. A method for configuring an apparatus for calibrating a semi-empirical process simulator, the method comprising the steps of:

*performing test processes under conditions where only a limited number of parameters contribute to a profile evolution;* deriving a set of test conditions for which [a] *the* profile evolution is governed only by [a] *the* limited number of parameters;

selecting a plurality of test values for each said set of test conditions;

subjecting a test substrate to a test process defined by said plurality of test values, thereby creating a test surface profile;

generating an approximate profile prediction from said plurality of test values;

adjusting said plurality of test values to minimize a discrepancy between said test surface profile and said approximate profile prediction, thereby solving for said limited number of parameters; and repeating said selecting, subjecting, generating, and revising for another said set of test conditions until said plurality of parameters is determined, thereby providing a final model of said profile evolution in terms said plurality of parameters.

16. An apparatus for calibrating a semi-empirical process simulator, the apparatus comprising:

a computer memory for storing a desired surface profile;

[a] *the* computer memory for storing a test surface profile, created by subjecting a test substrate to a test process defined by a respective plurality of parameters;

*means for performing test processes under conditions where only a limited number of parameters contribute to a profile evolution;* means for deriving a set of test conditions for which [a] *the* profile evolution is governed only by [a] *the* limited number of parameters;

means for selecting a plurality of test values for each said set of test conditions;

means for subjecting a test substrate to a test process defined by said plurality of test values, thereby creating a test surface profile;

means for generating an approximate profile prediction from said plurality of test values;

means for revising said plurality of test values to minimize a discrepancy between said test surface profile and said approximate profile prediction, thereby solving for said limited number of parameters; and means for repeating said selecting, subjecting, generating, and revising for another said set of test conditions until said plurality of parameters is determined, thereby providing a final model of said profile evolution in terms said plurality of parameters.

17. The apparatus of claim 16, further comprising a computer memory for storing a preliminary test value, the means for generating an approximate profile description from the initial surface profile model and the respective test value employing the preliminary test value.

18. A program storage device readable by a machine, tangibly embodying a program of instructions readable by the machine to perform a method for calibrating a semi-empirical process simulator, the method comprising:

*performing test processes under conditions where only a limited number of parameters contribute to a profile evolution;* deriving a set of test conditions for which [a] *the* profile evolution is governed only by [a] *the* limited number of parameters;

selecting a plurality of test values for each said set of test conditions;

subjecting a test substrate to a test process defined by said plurality of test values, thereby creating a test surface profile;

generating an approximate profile prediction from said plurality of test values;

adjusting said plurality of test values to minimize a discrepancy between said test surface profile and said approximate profile prediction, thereby solving for said limited number of parameters; and repeating said selecting, subjecting, generating and adjusting for another said set of test conditions until said plurality of parameters is determined, thereby providing a final model of said profile evolution in terms said plurality of parameters.

* * * * *